United States Patent
Son et al.

(10) Patent No.: US 7,704,843 B2
(45) Date of Patent: Apr. 27, 2010

(54) METHOD OF MANUFACTURING A SEMICONDUCTOR DEVICE

(75) Inventors: Yong-Hoon Son, Yongin-si (KR); Jong-Wook Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/334,883

(22) Filed: Dec. 15, 2008

(65) Prior Publication Data
US 2009/0155971 A1    Jun. 18, 2009

(30) Foreign Application Priority Data
Dec. 18, 2007    (KR) .......................... 2007-0132931

(51) Int. Cl.
*H01L 21/336*    (2006.01)
(52) U.S. Cl. .............................. 438/300; 257/E21.131; 257/E21.619; 257/E21.634
(58) Field of Classification Search .................. 438/300
See application file for complete search history.

(56) References Cited

U.S. PATENT DOCUMENTS

| | | | |
|---|---|---|---|
| 5,824,586 A | * | 10/1998 | Wollesen et al. ............ 438/300 |
| 6,891,232 B2 | | 5/2005 | Miyano et al. |
| 2005/0245073 A1 | * | 11/2005 | Lee et al. ..................... 438/629 |
| 2006/0131656 A1 | | 6/2006 | Shin et al. |
| 2006/0240656 A1 | * | 10/2006 | Ahn .......................... 438/597 |

FOREIGN PATENT DOCUMENTS

JP    2001-189451    7/2001

* cited by examiner

*Primary Examiner*—W. David Coleman
*Assistant Examiner*—Shaka Scarlett
(74) *Attorney, Agent, or Firm*—F. Chau & Associates, LLC

(57) ABSTRACT

In a semiconductor device and a method of manufacturing the same, a conductive structure is formed on an active region defined by a device isolation layer on a semiconductor substrate. The conductive structure includes a gate pattern and source/drain regions adjacent to the gate pattern. A first semiconductor layer is formed on the active region by a selective epitaxial growth (SEG) process. An amorphous layer is formed on the first semiconductor layer. A second semiconductor layer is formed from a portion of the amorphous layer by a solid-phase epitaxy (SPE) process. Elevated structures are formed on the source/drain regions by removing a remaining portion of the amorphous layer from the substrate, so the elevated structure includes the first semiconductor layer and the second semiconductor layer stacked on the first semiconductor layer. The device isolation layer may be prevented from being covered with the elevated structures, to thereby prevent contact failures.

16 Claims, 6 Drawing Sheets

METHOD OF MANUFACTURING A SEMICONDUCTOR DEVICE

CROSS-REFERENCE TO RELATED APPLICATIONS

This application claims priority under 35 U.S.C. §119 to Korean Patent Application No. 2007-132931, filed on Dec. 18, 2007, the disclosure of which is hereby incorporated by reference herein in it's entirety.

BACKGROUND

1. Technical Field

Example embodiments relate to a semiconductor device and to a method of manufacturing the same and, more particularly, to a semiconductor device having elevated source/drain (ESD) structures, and to a method of manufacturing the same.

2. Description of the Related Art

Due to the high degrees of integration of recent semiconductor devices decreased design rules for various elements of the semiconductor devices may now be required. However, the decreased design rules may cause transistors to have short channels and small contact areas between the transistors and various conductive structures. Particularly, the operational characteristics of a semiconductor memory device may be significantly influenced by a short channel and a small contact area of a transistor, because the semiconductor memory device may include a large number of transistors.

A short channel of the transistor may cause a short channel effect in the transistor, and thus a leakage current may be increased in the transistor and a refresh time may not be sufficiently obtained in a memory device. The small contact area may in turn cause contact resistance to increase at both the source electrode and the drain electrode of the transistor, and cause the process margin of a critical dimension to be reduced, to thereby generate a contact failure.

Consequently, various types of research have been conducted for enlarging the contact area at source/drain regions so as to reduce contact resistance at the source/drain regions. As a result of the above-mentioned research, an elevated source/drain (ESD) structure has been suggested and most widely used for enlarging a contact area at source/drain regions. A conventional ESD structure may include a stacked gate electrode having a spacer at both side walls thereof and epitaxial layers selectively grown at surface portions of an active region adjacent to the gate electrode.

However, as a conventional selective epitaxial growth (SEG) process is an isotropic process, the conventional ESD structure grows at the same rate both in a vertical direction perpendicular to the substrate and in a horizontal direction parallel with the substrate. Accordingly, the conventional ESD structure may have difficulties associated therewith in that the device isolation layer may be covered with the ESD structures and the source and drain regions of the active region adjacent to each other may not be electrically separated from each other.

FIG. 1 is a plan view illustrating a semiconductor device including a conventional ESD structure. In FIG. 1, a dash line indicates an active region before the source/drain regions are elevated and a dotted line indicates an active region of which the contact area is enlarged due to the elevation of the source/drain regions.

Referring to FIG. 1, a gate structure (not shown) is formed on a semiconductor substrate 10 in which a gate oxide layer and a gate stack are stacked on the substrate 10 and a gate spacer is formed at both side walls of the gate stack. The substrate 10 includes an active region 12 in which a conductive structure is positioned as a unit device for an electric circuit and a device isolation region 14 by which adjacent active regions are electrically isolated from each other; and thus the conductive structures on the adjacent active regions may be electrically isolated from each other. In general, an insulation layer (not shown) is formed in the device isolation region 14 by a shallow trench isolation (STI) process, to thereby form a device isolation layer (not shown) in the device isolation region 14 for electrically isolating the conductive structures on the adjacent active regions 12 from each other.

The source/drain regions adjacent to the gate structure are enlarged to an expanded area 12b from an original area 12a by a SEG process, and thus the contact area may be enlarged and the contact failures may be significantly reduced in the semiconductor device.

A SEG process is an anisotropic process, and thus a SEG layer may not be formed on the device isolation layer comprising oxide or nitride. However, as the design rule of a semiconductor device is decreased, the SEG process may be gradually transformed into an isotropic process in place of an ideal anisotropic process, and thus the device isolation layer may be partially covered with an epitaxial layer.

That is, the epitaxial layer of the ESD structure extends to an upper portion of the device isolation layer defining the active regions, so that the source/drain regions of the adjacent gate structures are not electrically separated from each other by the device isolation layer. Therefore, when contact plugs are formed on the ESD regions, adjacent contact plugs may be electrically connected to each other, and thus the adjacent source and drain regions may be electrically connected to each other, to thereby generate a 2-bit failure in the semiconductor device.

FIG. 2A is a cross-sectional view taken along a line I-I' of a portion A of the semiconductor device shown in FIG. 1, and FIG. 2B is a cross-sectional view taken along a line II-II' of a portion B of the semiconductor device shown in FIG. 1.

Referring to FIG. 2A, when the adjacent gate structures 20a and 20b are spaced apart from each other by a sufficient gap distance, epitaxial layers 30 grown at the source and drain regions may be sufficiently separated from each other to thereby form an elevated source region 34 and an elevated drain region 32 on the substrate 10. Thus, the elevated regions 34 and 32 at the source and drain regions may sufficiently function as source and drain regions for the adjacent gate structures 20a and 20b. A conductive structure such as a contact plug is individually formed on the elevated source and drain regions 34 and 32 and each of the conductive structures may be electrically operated independently from each other.

However, as shown in FIG. 2B, when the adjacent gate structures 20a and 20b are not sufficiently spaced apart from each other, the epitaxial layer is grown to cover the whole surface of the device isolation layer, and thus the device isolation layer may be fully covered with the epitaxial layer 30. Thus, the elevated drain region 32 for the first gate structure 20a may not be separated from the elevated source region 34 for the second gate structure 20b, and each of the contact plugs located on the elevated source and drain regions 34 and 32, respectively, may also electrically separated from each other, to thereby generate a bridge defect. As a result, the first and the second gate structures 20a and 20b may not be electrically separated from each other to thereby generate the 2-bit failure in the semiconductor device.

Accordingly, there is still a need for an improved method of forming an ESD structure in which lateral growth is sufficiently prevented on a surface of the substrate to thereby reduce contact failures such as the bridge defect.

SUMMARY OF THE INVENTION

Example embodiments may provide a method of manufacturing a semiconductor device including elevated source/drain (ESD) structures in which elevated source and drain regions may be sufficiently separated from each other to thereby reduce contact failures.

Example embodiments may provide a semiconductor device manufactured by the above-mentioned method.

In accordance with an example embodiment, a method of manufacturing a semiconductor device is provided. The method includes forming a conductive structure on an active region of a semiconductor substrate that is defined by a device isolation layer on the substrate. The conductive structure includes a gate pattern and source/drain regions adjacent to the gate pattern. The method further includes forming a first semiconductor layer on the active region of the substrate by a selective epitaxial growth (SEG) process, forming an amorphous layer on the first semiconductor layer, forming a second semiconductor layer from a portion of the amorphous layer by a solid-phase epitaxy (SPE) process performed on the amorphous layer and forming elevated structures on the source/drain regions of the conductive structure by removing a remaining portion of the amorphous layer from the substrate, so that the elevated structure includes the first semiconductor layer and the second semiconductor layer stacked on the first semiconductor layer.

In an example embodiment, the first semiconductor layer may be formed through the following steps: A baking process may be performed using hydrogen ($H_2$) on the substrate including the source and drain regions, to thereby rearrange atomic combinations at surfaces of the source and drain regions and at a surface of the gate pattern. Then, a polycrystalline semiconductor layer is formed on an upper surface of the gate pattern and a single crystalline semiconductor layer on the source/drain regions by a deposition of first layer materials and a SEG process. For example, the baking process includes a heat treatment to the substrate including the conductive structure at a temperature of about 800° C. to about 1,000° C. in a hydrogen ($H_2$) atmosphere. Further, the deposition of the first layer materials may be performed by a chemical vapor deposition (CVD) process at a temperature of about 700° C. to about 900° C. under a pressure of about 10 Torr to about 50 Torr. A reaction gas of the CVD process may include dichlorosilane ($SiH_2Cl_2$), germanium tetrahydride ($GeH_4$), methylsilane ($CH_3SiH_3$) and a mixture thereof. The first layer material may include at least one material selected from the group consisting of silicon (Si), germanium (Ge), silicon germanium (SiGe), silicon carbide (SiC) and combinations thereof. A selective etching process may be further performed against the substrate including the first semiconductor layer in such a manner that the polycrystalline semiconductor layer is removed from the upper surface of the gate pattern and the single crystalline semiconductor layer still remains on the source and drain regions of the substrate.

In an example embodiment, the amorphous layer may be formed by a deposition of amorphous materials onto the substrate including the conductive structure and the first semiconductor layer. For example, the deposition of the amorphous materials is performed one of a sputtering process, a low-pressure CVD (LPCVD) process and a plasma-enhanced CVD (PECVD) process at a temperature of about 400° C. to about 500° C. The amorphous material includes at least one material selected from the group consisting of silicon (Si), germanium (Ge), silicon germanium (SiGe), silicon carbide (SiC) and combinations thereof. Impurities may be further implanted onto the amorphous layer before the SPE process performed on the amorphous layer. The impurities may be implanted in-situ with the formation of the amorphous layer, and the impurities may include at least one material selected from the group consisting boron (B), phosphorus (P), arsenic (As) and combinations thereof.

In an example embodiment, the second semiconductor layer may be formed through the exemplarily steps as follows: A heat treatment may be performed on the substrate including the amorphous layer at a temperature of about 500° C. to about 600° C. in a hydrogen ($H_2$) atmosphere, and the amorphous layer on the source and drain regions may be transformed into a single crystalline semiconductor layer by the SPE process using the first semiconductor layer as a seed. For example, the amorphous silicon layer may grow into the single crystalline semiconductor layer by the SPE process in a vertical direction perpendicular to the substrate and in a horizontal direction parallel with the substrate, and a ratio of a growth, rate of the single crystalline semiconductor layer in the vertical direction with respect to that in the horizontal direction may be in a range of about 5:1 to about 9:1.

In an example embodiment, a remaining portion of the amorphous layer may be removed by a selective etching process using a mixture of hydrogen chloride (HCl) and hydrogen ($H_2$) as an etching gas at a temperature of about 700° C. to about 1,000° C. under a pressure of about 10 Torr to about 600 Torr.

In accordance with an example embodiment, a semiconductor device is provided. The semiconductor device includes a gate structure on an active region of a semiconductor substrate defined by a device isolation layer, a source region and a drain region at surface portions of the active region adjacent to the gate structure, a first semiconductor layer covering the source and drain regions and a second semiconductor layer covering the first semiconductor layer and a peripheral portion of the device isolation layer. The first semiconductor layer may be grown from surfaces of the source and drain regions by a selective epitaxial growth (SEG) process, and the second semiconductor layer may be grown greater in a vertical direction perpendicular to the substrate than in a horizontal direction parallel with the substrate by a solid-phase epitaxy (SPE) process using the first semiconductor layer as a seed.

In an example embodiment, the first and second semiconductor layers further include impurities therein, to thereby reduce contact resistance at the source and drain regions of the substrate. For example, the semiconductor device may further include an insulation interlayer covering the gate structure, the second semiconductor layer and the device isolation layer, and a contact plug penetrating the insulation interlayer and electrically connected to the second semiconductor layer.

According to some example embodiments, a semiconductor layer may be prevented from being grown horizontally and may be guided to grow vertically with respect to a substrate from source/drain regions of the substrate. Thus, a device isolation layer may be sufficiently prevented from being covered with the semiconductor layer and ESD structures may be sufficiently separated from each other. Therefore, as a result of the above, neighboring contact plugs on the respective ESD structures may be electrically independent from each other, to thereby prevent bridge defects and contact failures, such as a 2-bit failure caused by a bridge defect, in a semiconductor device including the ESD structures.

BRIEF DESCRIPTION OF THE DRAWINGS

Example embodiments can be understood in more detail from the following description taken in conjunction with the accompanying drawings.

DETAILED DESCRIPTION OF THE EXAMPLE EMBODIMENTS OF THE INVENTION

Figure 1:
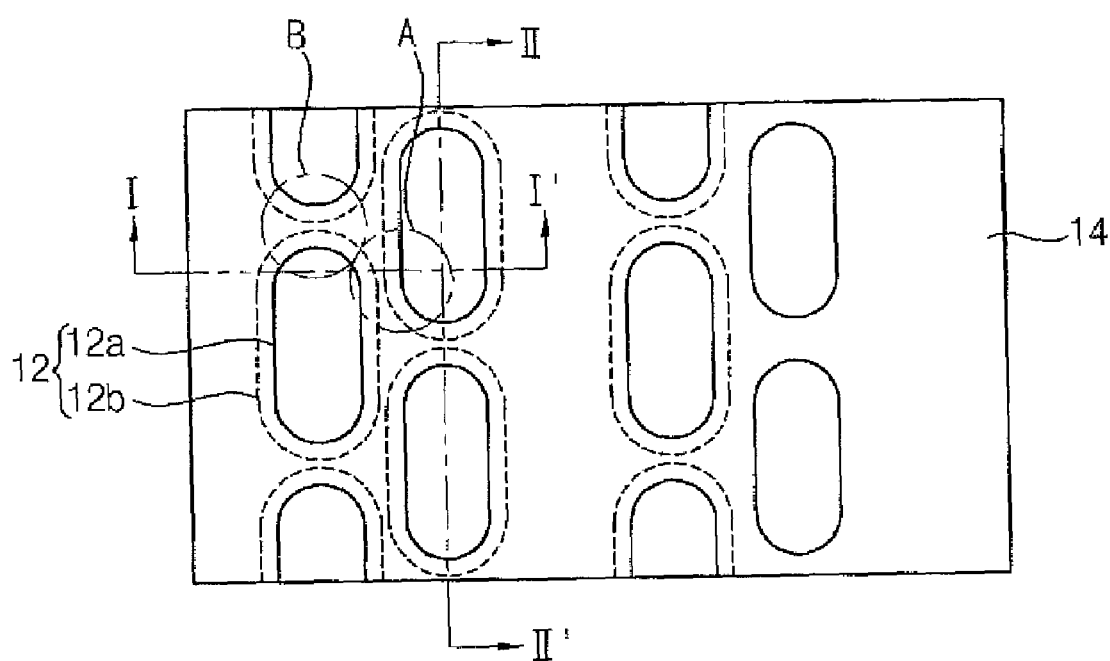
FIG. 1 is a plan view illustrating a semiconductor device including a conventional elevated source/drain (ESD) structure.
Figure 2A:
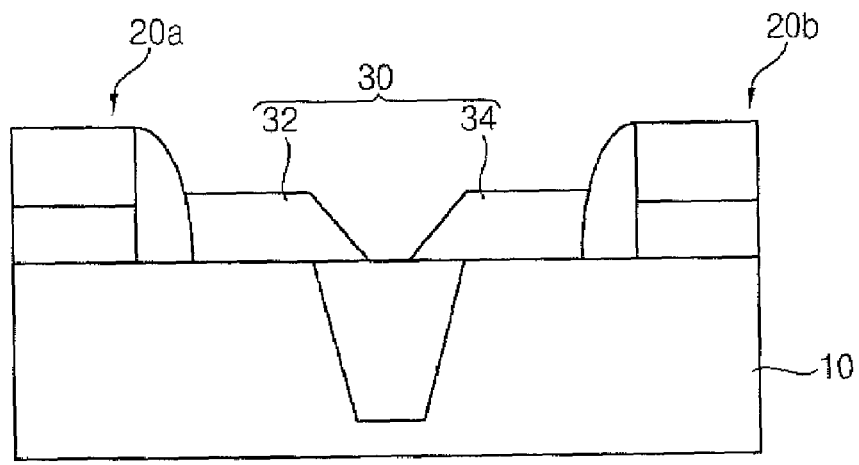
FIG. 2A is a cross-sectional view taken along a line I-I' of a portion A of the semiconductor device shown in FIG. 1.
Figure 2B:
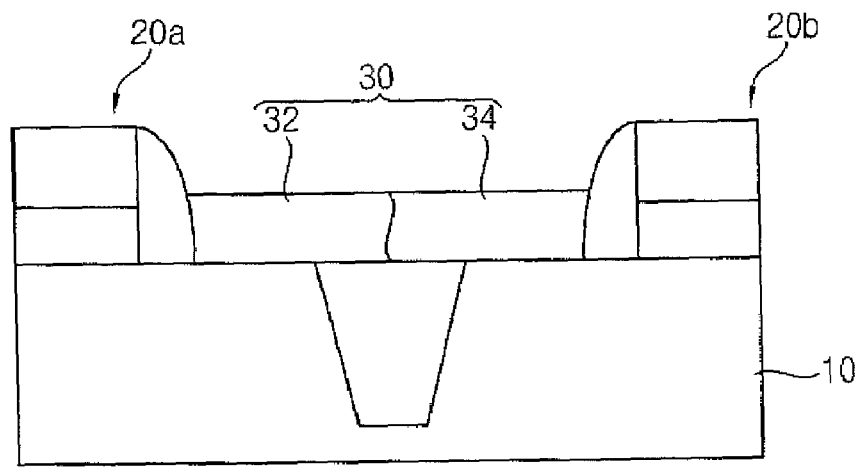
FIG. 2B is a cross-sectional view taken along a line II-II' of a portion B of the semiconductor device shown in FIG. 1.

The present invention is described more fully hereinafter with reference to the accompanying drawings, in which example embodiments of the present invention are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIGS. 3A to 3E are cross-sectional views illustrating processing steps for a method of manufacturing a semiconductor device in accordance with an example embodiment.

Figure 3A:
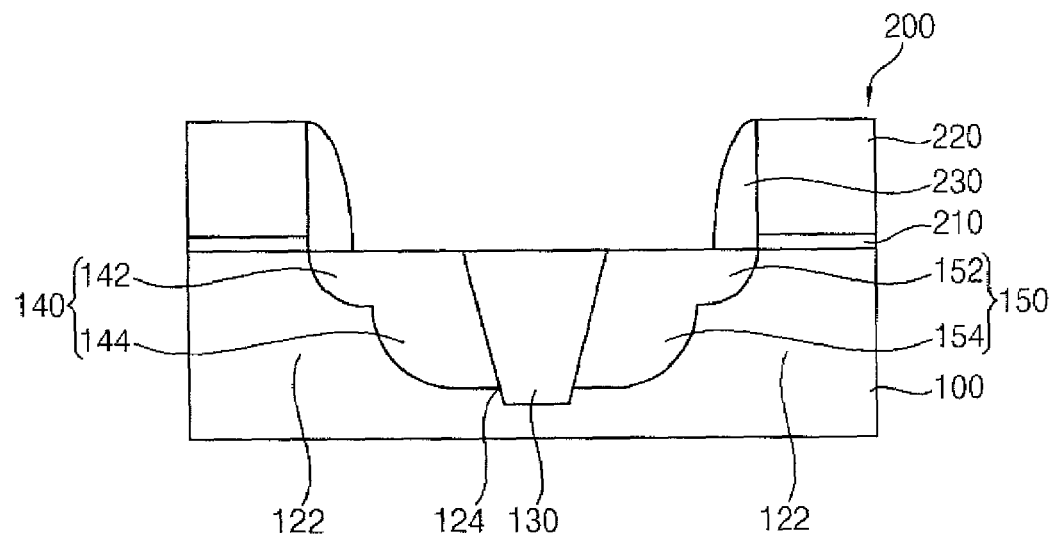
FIGS. 3A to 3E are cross-sectional views illustrating processing steps for a method of manufacturing a semiconductor device in accordance with an example embodiment.

Referring to FIG. 3A, a plurality of gate structures 200 is formed on a semiconductor substrate 100 and the gate structures 200 are separated from each other by a device isolation layer 130, and thus each of the gate structures 200 is electrically operated independently form each other.

In an example embodiment, an active region 122 is defined on the substrate 100 by the device isolation layer 130. The substrate 100 may include, for example, a silicon substrate, a silicon on insulator (SOI) substrate and a strained silicon substrate comprising germanium (Ge) or carbon (C). The device isolation layer may be formed on the substrate by, for example, a local oxidation of silicon (LOCOS) process or a shallow trench isolation (STI) process. In the present example embodiment, the device isolation layer 130 is formed by the STI process as follows: A shallow trench is formed at a field region defining the active region on the substrate 100 and an insulation layer such as, for example, a nitride layer and an oxide layer is formed in the trench. The active region 122 is defined by the device isolation layer 130, and thus adjacent active regions 122 are isolated from each other by the device isolation layer 130. A plurality of conductive structures 200 is formed on the active regions 122, respectively, and each of the conductive structures 200 are electrically isolated from each other by the device isolation layer 130. As a result, each of the conductive structures 200 on the active regions 122 may function as a unit device for a semiconductor integrated circuit.

In an example embodiment, the conductive structure 200 may include a gate pattern extending along the active region 122 of the substrate 100. For example, a gate insulation layer 210 is formed on the substrate 100 and a gate conductive layer 220 is formed on the gate insulation layer 210 and then the gate conductive layer 210 and the gate insulation layer 210 are patterned into the gate pattern on the active region 122 of the substrate 100. The gate conductive layer may include, for example, a polysilicon layer or a polycide layer having a polysilicon layer and a metal silicide layer stacked on the polysilicon layer. The metal silicide layer may improve the conductivity of the gate pattern.

A lightly doped junction areas 142 and 152 are formed at surface portions of the substrate 100 adjacent to the gate pattern by a first ion implantation process using the gate pattern as an ion implantation mask. Then, contaminants caused by the first ion implantation process and the gate insulation layer 210 are removed from the surface of the substrate 100 by a cleaning process. Thus, the gate insulation layer 210 may only remain under the gate conductive layer 220.

An insulation layer is formed on the substrate 100 to a sufficient thickness to cover the gate pattern and an anisotropic etching process is performed against the insulation layer to thereby form a gate spacer 230 on a sidewall of the gate pattern. As a result, a gate structure is formed on the substrate 100 as the conductive structure 200. Heavily doped junction areas 144 and 154 are formed at surface portions of the substrate 100 adjacent to the spacer by a second ion implantation process using the spacer as an ion implantation mask, to thereby form source and drain regions 140 and 150 at surface portions of the substrate 100 adjacent to the conductive structure 200.

Figure 3B:
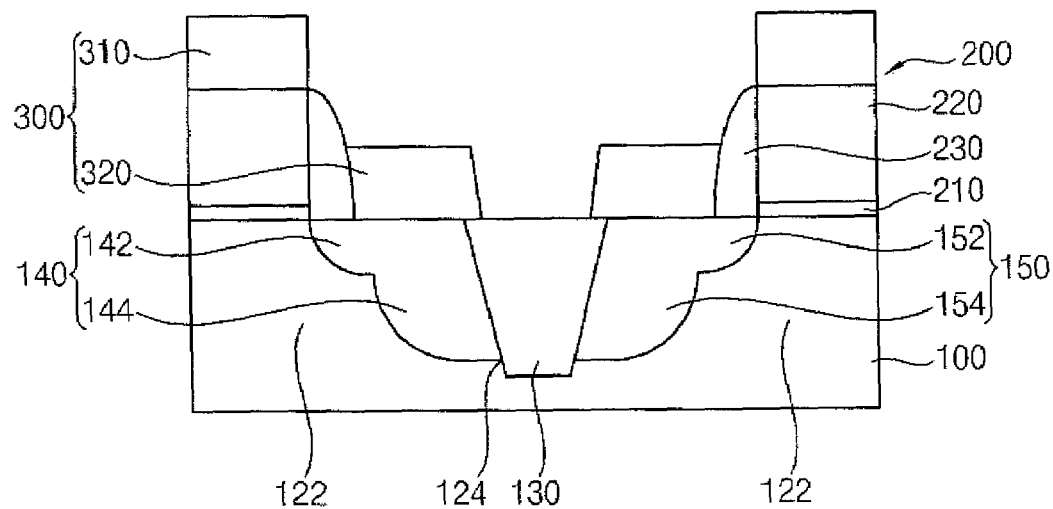

Referring to FIG. 3B, a first semiconductor layer 300 is formed on surfaces of the source/drain regions 140 and 150 and an upper surface of the gate structure 200 by, for example, a selective epitaxial growth (SEG) process.

An additional cleaning process may be performed on the surface of the substrate 100 after formation of the source/drain regions 140 and 150, so that a native oxide layer and residual contaminants are removed from the surface of the substrate 100. Then, for example, a hydrogen baking process may be further performed on the substrate 100 thereby curing silicon atoms of the substrate 100 damaged by the second ion implantation process and the additional cleaning process. For example, after completion of the additional cleaning process, a heat treatment may be performed on the substrate 100 at a temperature of, for example, about 800° C. to about 1,000° C. in a hydrogen atmosphere, so that atomic combinations with silicon atoms may be rearranged at the surfaces of the source/drain regions 140 and 150 and the upper surface of the gate structure 200.

Then, for example, a SEG process may be performed on the substrate 100 to thereby form the first semiconductor layer on the surfaces of the source/drain regions and the upper surface of the gate structure 200. In an example embodiment, a polycrystalline semiconductor layer 310 may be formed on the upper surface of the gate structure 200 and a single crystalline semiconductor layer 320 may be formed on the surfaces of the source/drain regions 140 and 150 of the substrate 100.

For example, the SEQ process may include a chemical vapor deposition (CVD) process in which layer materials are deposited onto the surface of the substrate 100 at a temperature of about 700° C. to about 900° C. under a pressure of about 10 Torr to about 50 Torr.

The CVD process may include, for example, a reduced-pressure CVD (RPCVD) process, a low-pressure CVD (LPCVD) process, an ultra-high vacuum CVD (UHVCVD) process and an metal-organic CVD (MOCVD) process. Examples of the layer material may include, but are not limited to silicon (Si), germanium (Ge), silicon germanium (SiGe), silicon carbon (SiC), silicon germanium (SiGe) doped with carbon (C), silicon germanium (SiGe) doped with phosphorus (P) and silicon germanium (SiGe) doped with boron (B). These may be used alone or in combinations thereof.

In an example embodiment, when the semiconductor layer 300 is selectively grown by a CVD process, various reaction gases may be supplied to a process chamber in accordance with the layer materials. For example, in a case where silicon (Si) is used as the layer material, dichlorosilane ($SiH_2Cl_2$) gas may be supplied into the process chamber as the reaction gas for the CVD process, and dichlorosilane ($SiH_2Cl_2$) gas and germanium tetrahydride ($GeH_4$) gas may be supplied into the process chamber as the reaction gas in a case where germanium silicon (GeSi) is used as the layer material. Further, for example, dichlorosilane ($SiH_2Cl_2$) gas and methylsilane ($CH_3SiH_3$) gas may be supplied into the process chamber as the reaction gas in a case where silicon carbon (SiC) is used as the layer material, and dichlorosilane ($SiH_2Cl_2$) gas, germanium tetrahydride ($GeH_4$) gas and methylsilane ($CH_3SiH_3$) gas may be supplied into the process chamber as the reaction gas in a case where carbon-doped silicon germanium (C-doped SiGe) is used as the layer material.

In an example embodiment, the SEG process for forming a plurality of the first semiconductor layer 300 may be performed to such a sufficient thickness that the surfaces of the source/drain regions 140 and 150 are covered with the first semiconductor layer 300. The semiconductor layer 300 is not formed on the device isolation layer 130 because the SEG process is usually an anisotropic process. However, the SEG process may be changed into an isotropic process as decrease of a design rule of a semiconductor device, and thus the first semiconductor layer 300 may be formed on a surface of the device isolation layer 130. Therefore, sufficient coating of the surfaces of the source/drain regions 140 and 150 with the first semiconductor layer 300 may cause a partial coating of a peripheral portion of the device isolation layer 130 with the first semiconductor layer 300, and thus the SEG process may be terminated instantly when the semiconductor layer 300 is formed on the peripheral portion of the device isolation layer 130.

While the above example embodiment discloses that the ion implantation for forming the source/drain regions may be performed prior to the SEG process, the ion implantation process may be performed simultaneously with or subsequent to the SEG process. When the SEG process is performed prior to the ion implantation process, impurities may be implanted onto both of the source/drain regions and the first semiconductor layer 300.

Figure 3C:
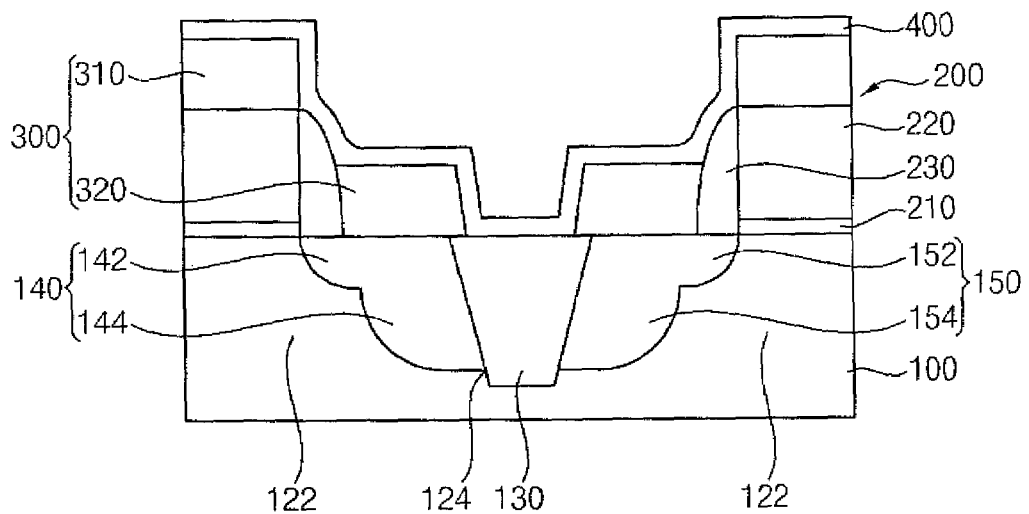

Referring to FIG. 3C, an amorphous layer 400 may be formed on the substrate 100 including the first semiconductor layer 300.

In an example embodiment, semiconductor materials may be deposited onto the surface of the device isolation layer 130 and onto the first semiconductor layer 300 at a temperature of, for example, about 400° C. to about 500° C. by, for example, a sputtering process, an LPCVD process or a plasma-enhanced CVD (PECVD) process, to thereby form the amorphous layer 400 on the device isolation layer 130 and the first semiconductor layer 300. Examples of the semiconductor material may include but are not limited to silicon (Si), germanium (Ge), silicon germanium (SiGe), silicon carbide (SiC), etc. These may be used alone or in combinations thereof.

For example, when an amorphous SiGe layer is formed by a CVD process, a mixture of a silicon source gas and a germanium source gas and a reducing agent may be supplied into a process chamber as reaction gases for the CVD process. For example, silane ($SiH_4$) gas or disilane ($Si_2H_6$) gas may be used as the silicon source gas and germane ($GeH_4$) gas may be used as the germanium source gas. Also, for example, hydrogen ($H_2$) gas may be used as the reducing agent. A minute structure and contact resistance of the amorphous SiGe layer may be decisively determined by, for example, the concentration of germanium (Ge), and thus the contact resistance of the amorphous SiGe layer may be controlled by, for example a mole ratio of the $SiH_4$ and $GeH_4$ gases or a mole ratio of the $SiH_6$ and $GeH_4$ gases. In the present example embodiment, the concentration of germanium (Ge) may be controlled into a range of, for example, about 2% to about 10%.

In a modified example embodiment, impurities may be implanted to the amorphous layer 400 to thereby control the contact resistance thereof. For example, p-type impurities such as boron (B) ions or n-type impurities such as phosphorus (P) ions and arsenic (As) ions may be implanted onto the amorphous layer 400. The ion implantation process onto the amorphous layer 400 may be performed in-situ with or subsequent to the deposition process for forming the amorphous layer 400.

Figure 3D:
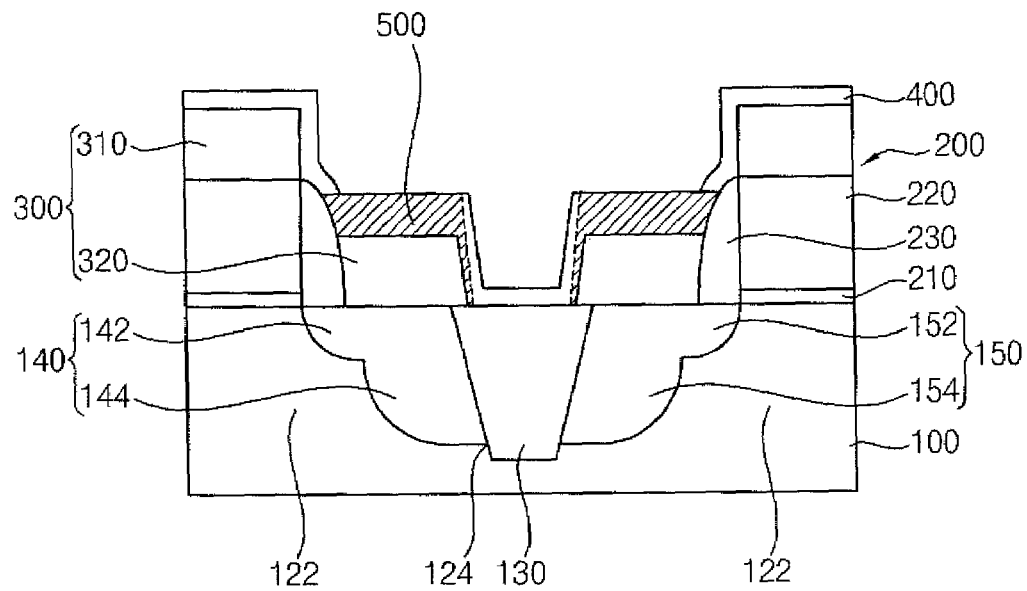

Referring to FIG. 3D, the amorphous layer 400 may be partially changed into a second semiconductor layer 500 by, for example, a solid-phase epitaxy (SPE) process.

In an example embodiment, a heat treatment may be performed on the substrate 100 including the amorphous layer 400 at a temperature of, for example, about 500° C. to about 600° C. in a hydrogen ($H_2$) atmosphere, so that the amorphous layer 400 may be partially crystallized into a solid state. That is, the amorphous layer 400 making contact with an upper surface and a side surface of the single crystalline semiconductor layer 320 may be grown into a solid state by, for example, a SEG process. In contrast, the amorphous layer 400 making contact with an upper surface of the polycrystalline semiconductor layer 310 and with the spacer 230 may not be changed into a solid state despite the same SEG process. That is, the amorphous layer 400 may still remain on the upper surface of the polycrystalline semiconductor layer 310 and with the spacer 230 without any change to the solid state. Accordingly, while the single crystalline semiconductor layer 320 on the source/drain regions 140 and 150 may function as a seed layer in the SPE process, the spacer 230 and the polycrystalline semiconductor layer 310 may not function as the seed layer in the SPE process. Thus, the epitaxial process for forming the second semiconductor layer 500 may be performed merely on the single crystalline semiconductor layer 320.

The epitaxial growth of the single crystalline semiconductor layer 320 may be largely performed in a vertical direction perpendicular to the substrate 100 rather than in a horizontal direction parallel with the substrate 100, and thus the second semiconductor layer 500 may be largely grown upwards from the single crystalline semiconductor layer 320 in the vertical direction and may be slightly grown from the single crystalline semiconductor layer 320 in the horizontal direction. Accordingly, the device isolation layer may be sufficiently prevented from being covered with the second semiconductor layer 500.

Figure 4:
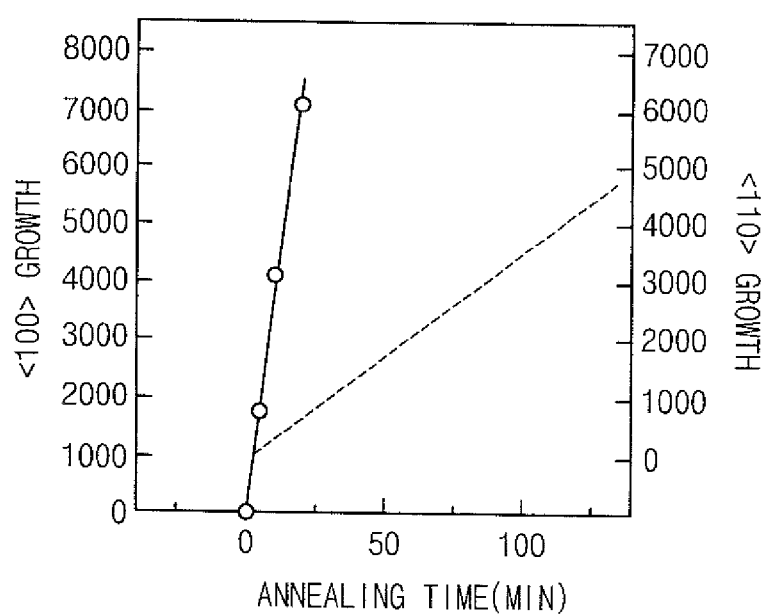
FIG. 4 is a graph showing a growth rate of the SPE process in accordance with a crystal orientation of silicon.

FIG. 4 is a graph showing a growth rate of the SPE process in accordance with a crystal orientation of silicon. In FIG. 4, a horizontal line indicates a processing time of a heat treatment in the SPE process and a vertical line indicates a thickness of an epitaxial layer by the SPE process. The expression <100> indicates a crystal orientation perpendicular to a surface of the substrate and the expression <110> indicates a crystal orientation parallel with the surface of the substrate. A heat treatment was performed on an amorphous silicon layer at a temperature of about 600° C. and the thickness of the solid epitaxial layer was measured in accordance with the crystal orientation.

As shown in FIG. 4, the amorphous silicon layer was formed into the solid epitaxial layer by the SPE process, and the solid epitaxial layer was grown to a thickness of about 7,000 Å in the vertical direction, while to a thickness of about 1,500 Å in the horizontal direction by an approximately 30-minute heat treatment. That is, the epitaxial layer was grown in the vertical direction at a rate of about 360 Å/min, while being grown in the horizontal direction at a rate of about 40 Å/min. FIG. 4 shows that the growth rate of the SPE process in the vertical direction was about 9 times higher than that in the horizontal direction.

Therefore, the amorphous layer 400 on the single crystalline semiconductor layer 320 may be formed into a semiconductor layer to a sufficient thickness in the vertical direction before the amorphous layer 400 on the device isolation layer 130 is formed into a semiconductor layer, to thereby by form the second semiconductor layer 500 on the single crystalline semiconductor layer 320. As a result, the semiconductor layers 320 and 500 may be formed only on the source/drain regions 140 and 150 and be prevented from being formed on the device isolation layer 130.

The growth rate of the amorphous layer 400 in the vertical and horizontal direction may be varied by compositions of the amorphous layer, mutual interactions between the single crystalline semiconductor layer 320 and the amorphous layer 400 and the temperature of the heat treatment for the SPE process. For example, when the amorphous layer includes silicon germanium (SiGe), a composition ratio of silicon (Si) and germanium (Ge) in the amorphous layer may have a decisive effect on the temperature of the heat treatment and a ratio of the growth rate of the SPE process between the vertical and the horizontal directions. In the present example embodiment, the temperature of the heat treatment and the composition of the amorphous layer may be controlled in such a manner that the ratio of the growth rate of the SPE process between the vertical and the horizontal directions is ranged, for example, from about 5:1 to about 9:1. Accordingly, the vertical growth of the SPE process may be much greater than the horizontal growth of the SPE process, and thus the device isolation layer may be sufficiently prevented from being covered with the single crystalline semiconductor layer.

Figure 3E:
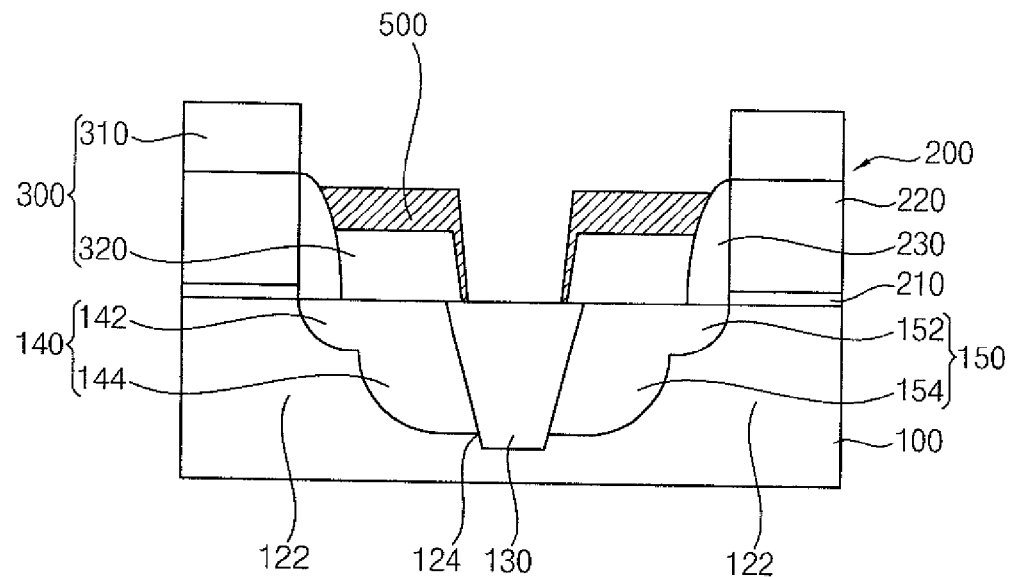

Referring to FIG. 3E, a residual amorphous layer 400 may be removed from the device isolation layer 130, the spacer 230 and the polycrystalline semiconductor layer 310, to thereby form elevated source/drain (ESD) structures 600 including the first semiconductor layer 310 comprising a single crystalline semiconductor and the second semiconductor layer 500.

In an example embodiment, for example, hydrogen (H₂) gas and hydrogen chloride (HCl) gas may be supplied into the process chamber at a temperature of, for example, about 700° C. to about 1,000° C. under a pressure of about 10 Torr to about 600 Torr, and thus the residual amorphous layer 400 may be removed from substrate 100 by a selective etching process. An etching rate of the selective etching process against the residual amorphous layer 400 may be controlled by, for example, the temperature and the pressure of the selective etching process and the amount of the etching gases for the selective etching process.

Further, an etching rate between the polycrystalline semiconductor device on the gate structure 200 and the second semiconductor layer 500 may also be varied in accordance with the temperature and the pressure of the selective etching process and the amount of the etching gases for the selective etching process. Therefore, a thickness of the ESD structure 600 and a thickness of the polycrystalline semiconductor layer 310 may also be adjusted by, for example, controlling the temperature and the pressure of the selective etching process and the amount of the etching gases for the selective etching process.

While the above example embodiment discusses that the polycrystalline semiconductor layer 310 is formed on the gate structure 200 and then the amorphous layer 400 is formed on the substrate 100 including the polycrystalline semiconductor layer 310, the polycrystalline semiconductor layer 310 may be removed from the gate structure 200 by the above-mentioned selective etching process prior to the formation of amorphous layer 400.

For example, when hydrogen chloride (HCl) is supplied into the process chamber at a flow rate of about 300 standard cubic centimeters per minute (SCCM) under a pressure of about 550 Torr and at a temperature of about 780° C., an etching rate of the polycrystalline semiconductor layer 310 may be about 5 times as that of the single crystalline semiconductor layer 320, and thus the polycrystalline semiconductor layer 310 may be etched off from the gate structure 200 about 5 times as rapidly as the single crystalline semiconductor layer 320 is removed from the substrate 100. Therefore, merely the single crystalline semiconductor layer 320 may be formed on the source/drain regions 140 and 150 before the amorphous layer 400 is formed on the substrate 100, and thus the ESD structure 600 may be formed on the substrate 100 without increasing the height of the gate structure 200 due to the polycrystalline semiconductor layer 310.

According to example embodiments of manufacturing a semiconductor device, a semiconductor layer for the ESD structure may be formed on the source/drain regions of the substrate without covering the device isolation layer with the semiconductor layer. Therefore, the semiconductor layers on the source and drain regions adjacent to each other may be sufficiently separated from each other, and thus contact structures on the adjacent source and drain regions, respectively, may be electrically separated from each other to thereby prevent contact failures or 2-bit failures in the semiconductor device.

Figure 5:
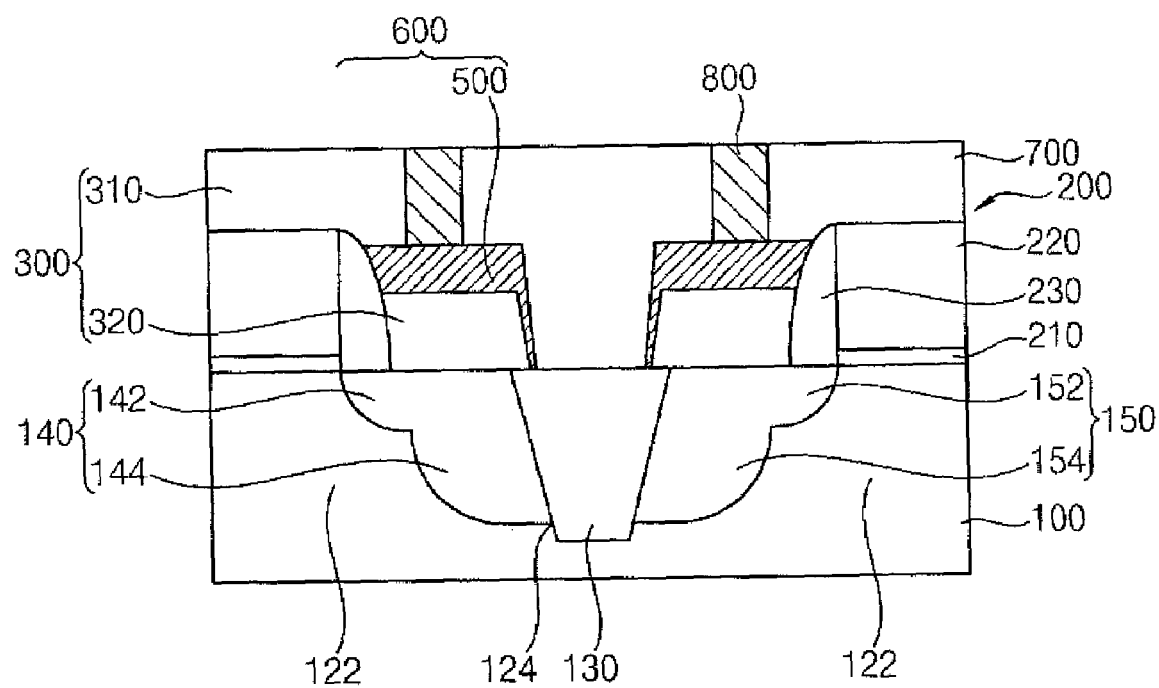
FIG. 5 is a cross-sectional view illustrating a semiconductor device including an ESD structure in accordance with an example embodiment.

FIG. 5 is a cross-sectional view illustrating a semiconductor device including an ESD structure in accordance with an example embodiment.

Referring to FIG. 5, the semiconductor device 900 in accordance with an example embodiment include a gate structure 200 on an active region 122 of the semiconductor substrate 100 such as a wafer that is defined by a device isolation layer 130. In an example embodiment, the gate structure 200 may include a gate pattern having a gate insulation layer 210 on the substrate 100, a gate conductive layer 220 on the gate insulation layer 210 and a gate spacer 230 on a sidewall of the gate pattern. Lightly and heavily doped source/drain junction areas 140 and 150 are located at surface portions of the substrate adjacent to the gate structure 200. The source region 140 of a first gate structure and the drain region 150 of a second gate structure adjacent to the first gate structure may be separated from each other by the device isolation layer 130, so that the adjacent source/drain regions 140 and 150 are electrically independent from each other.

For example, elevated source/drain structures 600 may be located on the source/drain regions 140 and 150, respectively, and the each of ESD structures 600 may include a first semiconductor layer 320, which is a single crystalline semiconductor layer by an SEG process, and a second semiconductor layer 500 by an SPE process. For example, the first and second semiconductor layers 320 and 500 may comprise silicon (Si), germanium (Ge), silicon germanium (SiGe), silicon carbide (SiC). These may be used alone or in combinations thereof. In a modified example embodiment, impurities may be implanted onto each of the first and second semiconductor layers 320 and 500, to thereby improve electrical properties of the ESD structures 600.

An elevated source structure 150 neighboring a first gate structure may be sufficiently spaced apart from an elevated drain structure 140 neighboring a second gate structure adjacent to the first gate structure, and thus the device isolation layer 130 may be sufficiently exposed through a gap between the ESD structures 600. Accordingly, the adjacent gate structures 200 may be electrically independent from each other in spite of the ESD structures 600.

An insulation interlayer 700 may be formed on the substrate 100 including the ESD structures 600, the gate structure 200 and the device isolation layer 130 to a sufficient thickness to cover the gate structures 200, and may have openings through which top surfaces of the ESD structures are exposed, respectively. A plurality of contact plugs may be positioned in the opening and electrically connected to the ESD structures 600, respectively. As the ESD structures 600 may be sufficiently spaced apart from each other, the contact plugs extending upwards from the respective ESD structures 600 may also be separated from each other, thereby sufficiently preventing bridge defects between the adjacent contact plugs and further preventing 2-bit failures caused by bridge defects of the contact plug in the semiconductor device.

While the above example embodiment discloses that no polycrystalline semiconductor layer is located on the gate structure 200, the polycrystalline semiconductor layer may be further located on the gate structure 200 through the same SEG process for the single crystalline semiconductor layer 320 as shown in FIG. 3D. The height of the gate structure 200 may be increased due to the polycrystalline semiconductor layer on the gate structure 200.

According to example embodiments of a semiconductor device, ESD structures may be sufficiently separated from each other and a device isolation layer is not covered with the ESD structures. Therefore, neighboring contact plugs on the respective ESD structures may be electrically independent from each other, to thereby prevent bridge defects and contact failures, such as a 2-bit failure caused by a bridge defect, in a semiconductor device including the ESD structures.

According to example embodiments, a semiconductor layer may be prevented from being grown horizontally and may be guided to grow vertically with respect to a substrate from source/drain regions of the substrate. Thus, a device isolation layer may be sufficiently prevented from being covered with the semiconductor layer and ESD structures may be sufficiently separated from each other. Therefore, neighboring contact plugs on the respective ESD structures may be electrically independent from each other, to thereby prevent bridge defects and contact failures in a semiconductor device including the ESD structures.

Having described the example embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a semiconductor device, comprising:
   forming a conductive structure on an active region of a semiconductor substrate that is defined by a device isolation layer on the substrate, the conductive structure including a gate pattern and source/drain regions adjacent to the gate pattern;
   forming a first semiconductor layer on the active region of the substrate by a selective epitaxial growth (SEG) process;
   forming an amorphous layer on the first semiconductor layer;
   forming a second semiconductor layer from a portion of the amorphous layer by a solid-phase epitaxy (SPE) process performed on the amorphous layer; and
   forming elevated structures on the source/drain regions of the conductive structure by removing a remaining portion of the amorphous layer from the substrate, so that the elevated structure includes the first semiconductor layer and the second semiconductor layer stacked on the first semiconductor layer.

2. The method of claim 1, wherein the forming of the first semiconductor layer includes:
   performing a baking process using hydrogen ($H_2$) on the substrate including the source and drain regions, to thereby rearrange atomic combinations at surfaces of the source and drain regions and at a surface of the gate pattern; and
   forming a polycrystalline semiconductor layer on an upper surface of the gate pattern and a single crystalline semiconductor layer on the source/drain regions by a deposition of first layer materials and a SEG process.

3. The method of claim 2, wherein the baking process includes a heat treatment to the substrate including the conductive structure at a temperature of about 800° C. to about 1,000° C. in a hydrogen ($H_2$) atmosphere.

4. The method of claim 2, wherein the deposition of the first layer materials is performed by a chemical vapor deposition (CVD) process at a temperature of about 700° C. to about 900° C. under a pressure of about 10 Torr to about 50 Torr.

5. The method of claim 4, wherein a reaction gas of the CVD process includes dichlorosilane ($SiH_2Cl_2$), germanium tetrahydride ($GeH_4$), methylsilane ($CH_3SiH_3$) and a mixture thereof.

6. The method of claim 2, wherein the first layer material includes at least one material selected from the group consisting of silicon (Si), germanium (Ge), silicon germanium (SiGe), silicon carbide (SiC) and combinations thereof.

7. The method of claim 2, further comprising performing a selective etching process against the substrate including the first semiconductor layer in such a manner that the polycrystalline semiconductor layer is removed from the upper surface of the gate pattern and the single crystalline semiconductor layer still remains on the source and drain regions of the substrate.

8. The method of claim 1, wherein the forming of the amorphous layer includes a deposition of amorphous materials onto the substrate including the conductive structure and the first semiconductor layer.

9. The method of claim 8, wherein the deposition of the amorphous materials is performed one of a sputtering process, a low-pressure CVD process (LPCVD) and a plasma-enhanced CVD (PECVD) process at a temperature of about 400° C. to about 500° C.

10. The method of claim 8, wherein the amorphous material includes at least one material selected from the group consisting of silicon (Si), germanium (Ge), silicon germanium (SiGe), silicon carbide (SiC) and combinations thereof.

11. The method of claim 8, further comprising implanting impurities onto the amorphous layer before the SPE process performed on the amorphous layer.

12. The method of claim 11, wherein the implanting of the impurities is performed in-situ with forming the amorphous layer.

13. The method of claim 11, wherein the impurities includes at least one material selected from the group consisting boron (B), phosphorus (P), arsenic (As) and combinations thereof.

14. The method of claim 1, wherein the forming of the second semiconductor layer includes:
   performing a heat treatment to the substrate including the amorphous layer at a temperature of about 500° C. to about 600° C. in a hydrogen ($H_2$) atmosphere; and
   transforming the amorphous layer on the source and drain regions into a single crystalline semiconductor layer by the SPE process using the first semiconductor layer as a seed.

15. The method of claim 14, wherein the amorphous silicon layer grows into the single crystalline semiconductor layer by the SPE process in a vertical direction perpendicular to the substrate and in a horizontal direction parallel with the substrate, and a ratio of a growth rate of the single crystalline semiconductor layer in the vertical direction with respect to that in the horizontal direction is in a range of about 5:1 to about 9:1.

16. The method of claim 1, wherein the removing of the remaining portion of the amorphous layer is performed by a selective etching process using a mixture of hydrogen chloride (HCl) and hydrogen ($H_2$) as an etching gas at a temperature of about 700° C. to about 1,000° C. under a pressure of about 10 Torr to about 600 Torr.

* * * * *